United States Patent
Rungta

(10) Patent No.: US 9,935,655 B2
(45) Date of Patent: Apr. 3, 2018

(54) READING OF DISTRIBUTED ERASURE-CODED DATA FROM AN ENTERPRISE OBJECT STORAGE SYSTEM

(71) Applicant: Cisco Technology, Inc., San Jose, CA (US)

(72) Inventor: Vandana Shyam Rungta, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 31 days.

(21) Appl. No.: 15/243,580

(22) Filed: Aug. 22, 2016

(65) Prior Publication Data

US 2017/0123728 A1 May 4, 2017

Related U.S. Application Data

(60) Provisional application No. 62/249,669, filed on Nov. 2, 2015.

(51) Int. Cl.
*G06F 3/06* (2006.01)
*H03M 13/15* (2006.01)
*G06F 11/10* (2006.01)

(52) U.S. Cl.
CPC ......... *H03M 13/154* (2013.01); *G06F 3/064* (2013.01); *G06F 3/067* (2013.01); *G06F 3/0611* (2013.01); *G06F 3/0613* (2013.01); *G06F 3/0619* (2013.01); *G06F 3/0643* (2013.01); *G06F 11/1076* (2013.01)

(58) Field of Classification Search
CPC .... G06F 3/0619; G06F 3/0611; G06F 3/0613; G06F 3/067; G06F 3/0643; G06F 11/1076
USPC ........................................................ 711/154
See application file for complete search history.

(56) References Cited

U.S. PATENT DOCUMENTS

| | | | |
|---|---|---|---|
| 2010/0094921 A1* | 4/2010 | Roy ........................ | G06F 15/16 709/201 |
| 2013/0173956 A1* | 7/2013 | Anderson ........... | G06F 11/1076 714/6.24 |
| 2015/0207522 A1* | 7/2015 | Anderson ........... | G06F 11/1076 714/758 |

(Continued)

*Primary Examiner* — Than Nguyen
(74) *Attorney, Agent, or Firm* — Ronald Fernando

(57) ABSTRACT

Various implementations disclosed herein enable reading of an erasure-coded file striped across one or more storage entities of an enterprise object storage system. For example, in various implementations, a method of reading an erasure-coded file is performed by an ingest entity of a storage system that includes a cluster of storage entities. The ingest entity includes a non-transitory computer readable storage medium, and one or more processors. In various implementations, the method includes querying the storage entities of the cluster to determine where data segments of an erasure-coded file are located within the cluster. In various implementations, the method includes generating a mapping of the data segments across the storage entities. The mapping indicates a sequence for the data segments within the erasure-coded file. In various implementations, the method includes scheduling read requests for the data segments based on the sequence. The scheduling satisfies a storage utilization threshold.

20 Claims, 6 Drawing Sheets

(56) References Cited

U.S. PATENT DOCUMENTS

2015/0234612 A1* 8/2015 Himelstein ........... G06F 3/0619
                                                         714/6.21
2016/0299707 A1* 10/2016 Botes .................... G06F 3/0608

* cited by examiner

READING OF DISTRIBUTED ERASURE-CODED DATA FROM AN ENTERPRISE OBJECT STORAGE SYSTEM

PRIORITY CLAIM

This application claims priority to U.S. provisional patent application No. 62/249,669 filed on Nov. 2, 2015, the contents of which are hereby incorporated by reference.

TECHNICAL FIELD

The present disclosure relates generally to enterprise object storage systems, and in particular, to reading of distributed erasure-coded data from an enterprise object storage system.

BACKGROUND

Some previously available storage systems provide fault tolerance through data mirroring. With data mirroring, multiple copies of an object are stored on a vault disk and again on different drives, so that a drive failure can only damage at most one copy of the data. The downside of data mirroring is that it is expensive due to being resource-intensive. For example, to be resilient to one failure, a storage system that utilizes data mirroring has to double the disk space available. Similarly, to be resilient to two failures, a storage system that utilizes data mirroring has to triple the disk space available. Furthermore, data mirroring often results in a policy conflict for recording various media programs. Specifically, when recording a program on behalf of a customer, the Digital Millennium Copyright Act (DMCA) provides that one and only one unique instance of the data may be created for the customer.

BRIEF DESCRIPTION OF THE DRAWINGS

So that the present disclosure can be understood by those of ordinary skill in the art, a more detailed description may be had by reference to aspects of some illustrative implementations, some of which are shown in the accompanying drawings.

Figure 1:
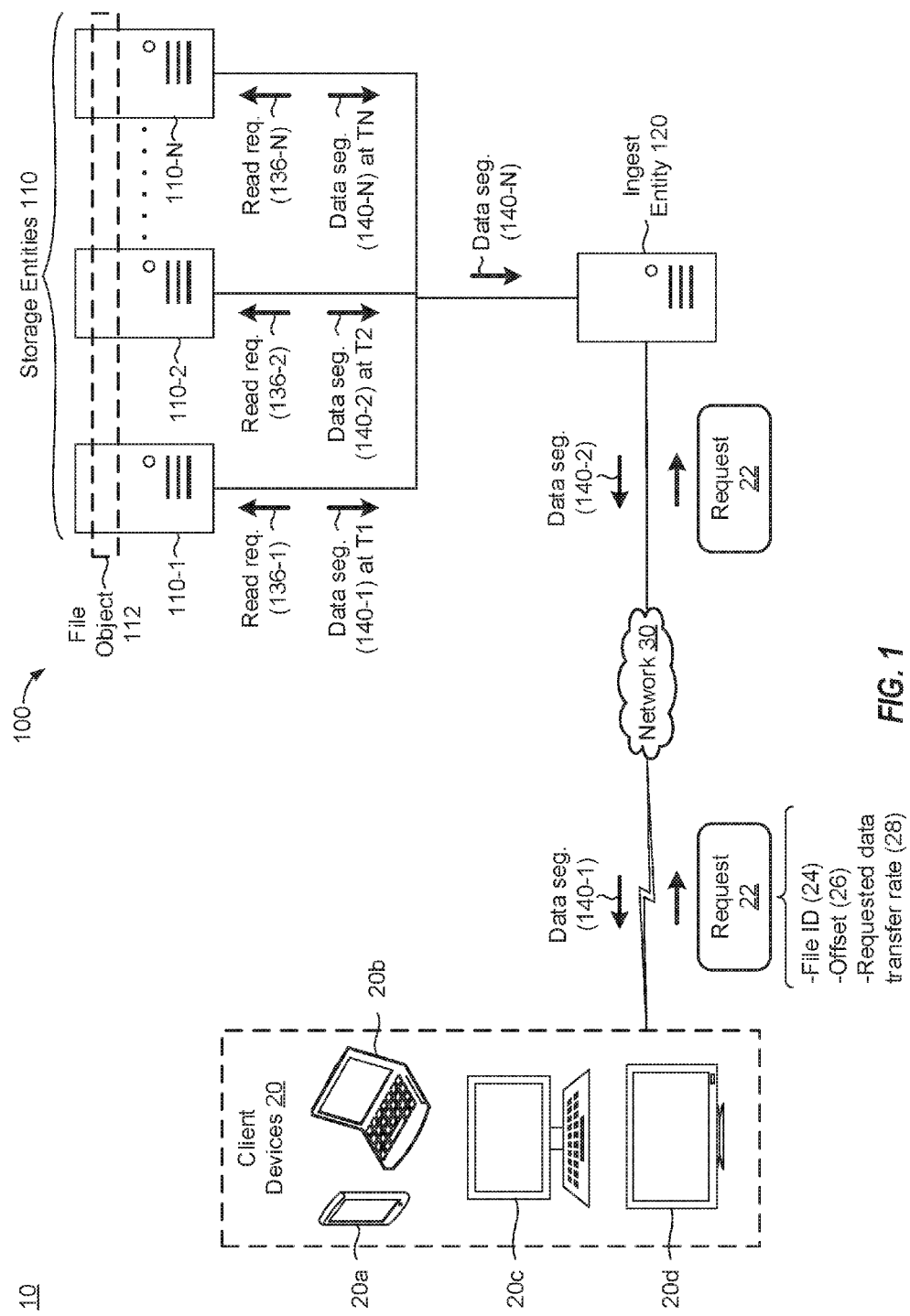
FIG. 1 is a schematic diagram of a storage system environment that includes a fault-tolerant enterprise object storage system in communication with a client device in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DESCRIPTION OF EXAMPLE EMBODIMENTS

Numerous details are described herein in order to provide a thorough understanding of the illustrative implementations shown in the accompanying drawings. However, the accompanying drawings merely show some example aspects of the present disclosure and are therefore not to be considered limiting. Those of ordinary skill in the art will appreciate from the present disclosure that other effective aspects and/or variants do not include all of the specific details of the example implementations described herein. While pertinent features are shown and described, those of ordinary skill in the art will appreciate from the present disclosure that various other features, including well-known systems, methods, components, devices, and circuits, have not been illustrated or described in exhaustive detail for the sake of brevity and so as not to obscure more pertinent aspects of the example implementations disclosed herein.

Overview

Some previously available storage systems include an ingest entity that is connected to various storage entities of the storage system. The ingest entity is usually capable of writing objects to the storage entities and reading objects from the storage entities. Typically, the ingest entity receives read and write requests from client devices. Upon receiving a write request for an object, the ingest entity writes the object to a storage entity. Upon receiving a read request for an object, the ingest entity retrieves the object from a storage entity that stores the object. Once the ingest entity has retrieved the entire object from the storage entity, the ingest entity begins transmitting the object to the client device. Typically, the object is cached at the ingest entity until the object is completely transmitted to the client device. The ingest entity typically receives numerous concurrent requests from various client devices. As such, the ingest entity usually utilizes a relatively large amount of storage space to cache the requested objects. Moreover, a relatively low data transfer rate at a client device can increase the amount of time that a requested object remains cached at the ingest entity, and thus exacerbates memory usage.

Various implementations disclosed herein enable reading of erasure-coded data (e.g., an erasure-coded file) striped (e.g., stored) across one or more storage entities (e.g., network entities such as servers) of a fault-tolerant enterprise object storage system ("storage system", hereinafter for the sake of brevity). For example, in various implementations, a method of reading an erasure-coded file is performed by an ingest entity of the storage system. In various implementations, the storage system includes a cluster of storage entities. In various implementations, the ingest entity includes a non-transitory computer readable storage medium, and one or more processors. In various implementations, the method includes querying the storage entities of the cluster to determine where data segments of an erasure-coded file are located within the cluster, in response to a request to read the erasure-coded file striped across one or more storage entities within the cluster of storage entities. In various implementations, the method includes generating a mapping data structure that includes a mapping of the data segments across the storage entities. In some implementations, the mapping data structure includes indications of a sequence for the data segments within the erasure-coded file. In various implementations, the method includes scheduling read requests for the data segments based on the sequence indicated by the mapping. In some implementations, scheduling the read requests satisfies a storage utilization threshold.

Example Embodiments

FIG. 1 is a schematic diagram of a storage system environment 10 in accordance with some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, as a non-limiting example, the storage system environment 10 includes one or more client devices 20, a network 30 (e.g., a public/external network such as portions of the Internet, and/or a private network), and a fault-tolerant enterprise object storage system 100 ("storage system 100", hereinafter for the sake of brevity).

In operation, the storage system 100 is utilized to store various objects. In some implementations, an object refers to a data asset. In some implementations, an object includes a data asset that is presentable to a user via the client device 20. For example, the object includes a video file that represents a movie or a TV show, an audio file that represents a song, a text file, etc. In various implementations, the object includes a file of any file type (e.g., .mov, .wma, .mp4, .avi, .mp3, .jpg, .txt, .doc, .docx, .xls, .ppt, etc.) In some implementations, an object includes a data asset that represents a set of computer-readable instructions that are executable at the client device 20. For example, in some implementations, the object includes a native application that is downloaded and installed at the client device 20, a browser plugin, etc.

In various implementations, the storage system 100 includes a cluster of storage entities 110 (e.g., storage entities 110-1, 110-2 . . . 110-N), and an ingest entity 120. The storage entities 110 store objects. For example, as exemplified in FIG. 1, the storage entities 110 collectively store a file object 112. In various implementations, some of the storage entities 110 are configured to store object data for the file object 112, and some of the remaining storage entities 110 are configured to store parity data (e.g., parity information) for the file object 112. In some implementations, the storage entities 110 that store object data for the file object 112 are referred to as data storage entities, and the storage entities 110 that store parity data for the file object 112 are referred to as one or more parity storage entities. The storage system 100 utilizes any suitable combination of methods and systems for synthesizing the parity data. In various implementations, the storage system 100 utilizes the parity data to recover (e.g., rebuild, reconstruct, restore, and/or repair) the file object 112 in the event of a data loss. In some implementations, the storage entities 110 and the ingest entity 120 are network entities such as servers.

In some implementations, a storage entity 110 includes one or more computer readable storage mediums. For example, the storage entity 110 includes solid state memory devices, hard disk memory devices, optical disk drives, read-only memory and/or nanotube-based storage devices. In some implementations, the storage entities 110 includes servers that execute computer-readable instructions. In various implementations, a storage entity 110 includes various blocks (not shown). For example, in some implementations, a storage entity 110 that stores object data includes data blocks for storing the object data. Similarly, a storage entity 110 that stores parity data includes parity blocks for storing the parity data. As described herein, in various implementations, a block refers to the smallest addressable block of memory (e.g., the smallest allocation unit of data) in a storage entity 110. In some implementations, the blocks are identically-sized (e.g., 2 MB each) for processing convenience.

In various implementations, the ingest entity 120 serves as an interface for the storage system 100. The ingest entity 120 receives/transmits data from/to a device that is external to the storage system 100. Specifically, the ingest entity 120 receives/transmits data from/to the client devices 20. In various implementations, receiving/transmitting data includes receiving/transmitting the objects. Additionally and/or alternatively, receiving/transmitting data includes receiving/transmitting instructions. In some implementations, the instructions include operations that are performed in relation to the objects. Example instructions include writing an object, reading an object, deleting an object, copying an object, etc. In some implementations, the ingest entity 120 includes hardware and/or software that enables the ingest entity 120 to perform various operations described herein. In some examples, the ingest entity 120 is implemented by a server system (e.g., as exemplified in FIG. 6). In some implementations, the ingest entity 120 is configured to operate as one of the storage entities 110. Put another way, in some implementations, one of the storage entities 110 is configured to operate as the ingest entity 120.

In various implementations, the storage system 100 utilizes various methods and systems associated with distributed erasure coding. In some implementations, the storage system 100 distributes an object across multiple (e.g., all) storage entities 110. For example, the storage system 100 stores the first 2 MB of the object data at storage entity 110-1, the next 2 MB of the object data at storage entity 110-2, etc. In some implementations, the storage system 100 distributes the object across multiple storage entities 110 even if the object is small enough to be stored at a single storage entity 110. Distributing the object data and/or the parity data across multiple storage entities 110 reduces the risk of losing the entire object in the event of a data loss. To that end, in various implementations, an erasure-coded file refers to a file that is stored in accordance with distributed erasure coding.

In the example of FIG. 1, the storage system 100 (e.g., the ingest entity 120) receives a request 22 to read at least a portion of an erasure-coded file ("file", hereinafter for the sake of brevity) stored in the storage system 100. In some implementations, the request 22 includes a file identifier (ID) 24 that identifies the file that the client device 20 is requesting. In some examples, the file identifier 24 includes a file name (e.g., a series of alphanumeric characters, for example, one or more words). In various implementations, the file identifier 24 includes a unique identifier that identifies the requested file. In some implementations, the request 22 includes an offset value 26 that identifies a specific portion of the file. In some examples, the offset value 26 indicates a location within the file from the start of the file. In some implementations, the offset value 26 includes a length or a range of values to indicate a specific portion of the file that is being requested.

In some implementations, the request 22 indicates a requested data transfer rate 28. In some implementations, the requested data transfer rate 28 includes a specific rate at which the requested file is to be transferred to the client device 20. For example, a requested data transfer rate 28 of 10 Megabits/s indicates that the requested file is to be transferred to the client device 20 at 10 Megabits/s. In some implementations, the requested data transfer rate 28 indicates a realizable data throughput (e.g., a maximum data throughput) at the client device 20. In some examples, a request 22 that includes a requested data transfer rate 28 is referred to as a rated request. In some implementations, the request 22 indicates that the file is to be transferred using a best effort delivery scheme (e.g., as fast as possible). In some implementations, the request 22 includes additional information, such as a request for delayed delivery of content, or bursts of high-rate content delivery. In some examples, the request 22 indicates that the requested file is to be transferred at a specific time that is different from a current time. In some implementations, the request 22 includes a request to delay sending the file. In some examples, the request 22 includes a request to send the file in one or more high-rate bursts.

The ingest entity 120 transmits data segments 140 (e.g., data segments 140-1, 140-2 . . . 140-N) of the requested file (e.g., the file object 112) to the client device 20 in response to receiving the request 22. In various implementations, the ingest entity 120 determines where data segments 140 of the requested file are located within the cluster of storage entities 110. In response to determining where the data segments 140 are located, the ingest entity 120 schedules read requests 136 (e.g., read requests 136-1, 136-2 . . . 136-N). In some implementations, the ingest entity 120 schedules the read requests 136 such that a storage utilization threshold is satisfied. In some examples, the ingest entity 120 schedules the read requests 136 such that the data segments 140 cached at the ingest entity 120 represent less than a predetermined percentage of the requested file (e.g., less than 25% of the requested file is cached at the ingest entity 120 at any given time). In response to scheduling the read requests 136, the ingest entity 120 receives the data segments 140 from the storage entities 110. In some implementations, the ingest entity 120 schedules the read requests 136 such that the ingest entity 120 receives the data segments 140 at different times (e.g., time T1, T2 . . . TN). For example, in some implementations, the ingest entity 120 schedules the read requests 136 according to the requested data transfer rate 28 indicated by the request 22. In various implementations, the ingest entity 120 transmits a data segment 140 (e.g., each data segment 140) to the client device 20 upon receiving the data segment 140 from a storage entity 110 that stores the data segment 140.

In some implementations, the ingest entity 120 purges a particular data segment 140 after transmitting that particular data segment 140 to the client device 20. For example, the ingest entity 120 purges data segments 140-1, 140-2 after transmitting the data segments 140-1, 140-2 to the client device 20 even though the ingest entity 120 has not delivered the data segment 140-N to the client device 20. Advantageously, in various implementations, the ingest entity 120 does not simultaneously cache all the data segments 140 of the file object 112. In various implementations, the rate at which the ingest entity 120 requests the data segments 140 is a function of (e.g., within a threshold range of) the requested data transfer rate 28. Hence, the ingest entity 120 avoids contributing to unnecessary network congestion within the storage system 100.

In some implementations, the storage entities 110-1, 110-2 . . . 110-N are implemented on the same computing device. Alternatively, in some implementations, the storage entities 110-1, 110-2 . . . 110-N are implemented on different computing devices. In some implementations, the storage system 100 is a distributed storage system including multiple computing devices networked over multiple locations. In some implementations, the storage system 100 is configured to store video data associated with multicast (e.g., broadcast) content. In other words, the storage system 100 serves as a digital video recorder (DVR). In some implementations, the storage system 100 serves as a cloud-based DVR, since the storage system 100 is capable of servicing read requests (e.g., the request 22) and write requests that the storage system 100 receives over the network 30.

In various implementations, the client devices 20 include any suitable computing device, such as a computer, a laptop computer, a tablet device, a netbook, an internet kiosk, a personal digital assistant, a mobile phone, a smartphone, a wearable, a gaming device, a computer server, etc. In some implementations, each client device 20 (e.g., a mobile computing device 20a, a laptop computer 20b, a desktop computer 20c, a television 20d, etc.) includes one or more processors, one or more types of memory, a display and/or other user interface components such as a keyboard, a touch screen display, a mouse, a track-pad, a digital camera and/or any number of supplemental devices to add functionality. In some implementations, a client device 20 includes a suitable combination of hardware, software and firmware configured to provide at least some of protocol processing, modulation, demodulation, data buffering, power control, routing, switching, clock recovery, amplification, decoding, and error control.

Figure 2:
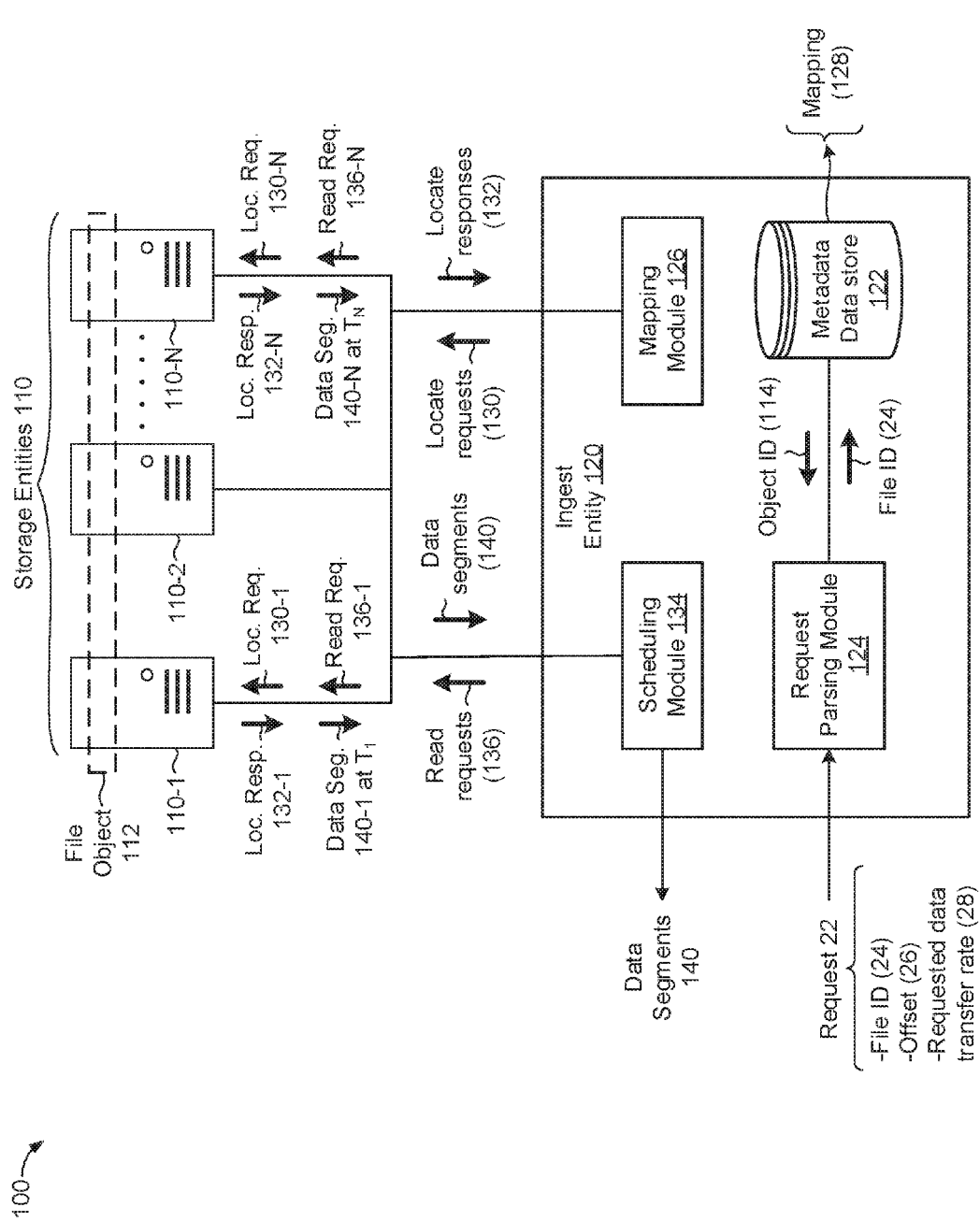
FIG. 2 is a block diagram of the fault-tolerant enterprise object storage system in accordance with some implementations.

FIG. 2 is a block diagram of the storage system 100 in accordance with some implementations. In various implementations, the ingest entity 120 includes a metadata data store 122, a request parsing module 124, a mapping module 126, and a scheduling module 134. In various implementations, the request parsing module 124, the mapping module 126, and the scheduling module 134 are implemented in hardware (e.g., as one or more application specific integrated circuits (ASICs)) and/or in software (e.g., as one or more sets of computer readable instructions that are executed by one or more central processing units). In various implementations, the metadata data store 122 stores metadata associated with objects stored in the storage system 100. The request parsing module 124 parses the request 22. The mapping module 126 determines where various data segments 140 of the requested file are located. The scheduling module 134 schedules read requests 136 for the data segments 140.

In various implementations, the metadata data store 122 stores metadata associated with objects that are stored in the storage system 100. For example, in some implementations, the metadata data store 122 stores object identifiers (Ds) for objects that are stored in the storage entities 110. In some implementations, the objects are associated with other identifiers (e.g., file identifiers). In such implementations, the metadata data store 122 stores the object IDs and the file IDs associated with the objects stored in the storage system 100. In some examples, the metadata data store 122 includes an index (e.g., an inverted index) that indexes the file IDs to the object IDs. To that end, the metadata data store 122 includes one or more databases, tables (e.g., look-up tables), and/or other suitable data structure.

In various implementations, the request parsing module 124 parses the request 22. In some implementations, the request parsing module 124 determines that the file II) 24 specified in the request 20 corresponds with the file object 112. In some implementations, the metadata data store 122 stores object IDs and file Ms for objects that are stored in the storage entities 110. In such implementations, the request parsing module 124 queries the metadata data store 122 with the file ID 24, and receives the object ID 114 for the file object 112. In some implementations, the request parsing module 124 provides the object ID 114 to the mapping module 126, so that the mapping module 126 can determine where various data segments segments 140 of the file object 112 are located. In some implementations, the request parsing module 124 also provides the offset 26 to the mapping module 126, so that the mapping module 126 can determine where the requested portions of the file object 112 are located. In some implementations, the request parsing module 124 determines whether the request 22 is a rated request. If the request parsing module 124 determines that the request 22 is a rated request, then the request parsing module 124 provides the requested data transfer rate 28 to the scheduling module 134, so that scheduling module 134 can schedule the read requests 136 according to the requested data transfer rate 28.

The mapping module 126 generates a mapping data structure that includes a mapping 128. The mapping 128 indicates the location of the data segments 140 across the storage entities 110. In other words, for each data segment 140, the mapping 128 indicates the storage entity 110 that stores the data segment 140. In some implementations, the mapping module 126 transmits locate requests 130 (e.g., locate requests 130-1, 130-2 . . . 130-N) to the storage entities 110. The locate requests 130 include the object ID 114. Upon transmitting the locate requests 130, the mapping module 126 receives locate responses 132 from the storage entities 110. The locate response 132 from a particular storage entity 110 indicates whether that particular storage entity 110 stores any data segments 140 of the file object 112 associated with the object ID 114 included in the locate request 130. In some implementations, the locate response 132 from a particular storage entity 110 identifies the data segment(s) 140 stored at that particular storage entity 110. In various implementations, the mapping module 126 generates (e.g., synthesizes) the mapping 128 based on the locate responses 132. In some implementations, the mapping data structure includes a database, a table such as a look-up table, and/or an index such as an inverted index. For example, in some implementations, the mapping data structure includes an index that indexes data segment IDs (not shown) to storage entity IDs (not shown). In some implementations, the mapping module 126 stores the mapping data structure (e.g., the mapping 128) in the metadata data store 122.

In some implementations, the mapping module 126 determines a sequence for the various data segments 140. In other words, in some implementations, the mapping module 126 orders the data segments 140 based on the portions of the file object 112 that the data segments correspond with. In such implementations, the mapping 128 indicates the sequence of the data segments 140. In various implementations, the mapping data structure (e.g., the mapping 128) includes indications of the sequence of the data segments 140. For example, if the file object 112 is a movie and the data segments 140 are different portions of the movie, then the mapping 128 identifies the data segment 140 that corresponds with the first portion of the movie (e.g., data segment 140-1), the data segment 140 that corresponds with the second portion of the movie (e.g. data segment 140-2), etc.

The scheduling module 134 schedules read requests 136 for the data segments 140. In various implementations, the scheduling module 134 accesses the mapping data structure (e.g., the mapping 128) to determine where the various data segments 140 are located. In some implementations, the scheduling module 134 schedules the read requests 136 based on the requested data transfer rate 28 specified in the request 22. In some examples, the scheduling module 134 schedules the read requests 136 such that the ingest entity 120 receives the data segments 140 at a rate that is a function of the requested data transfer rate 28. In some examples, the scheduling module 134 schedules the read requests 136 such that the ingest entity 120 receives the data segments 140 at a rate that is within a threshold range of the requested data transfer rate 28 (e.g., within 10% of the requested data transfer rate 28). To that end, the ingest entity 120 (e.g., the scheduling module 134) receives the data segments 140 at different times data segment 140-1 at T1, data segment 140-2 at T2 . . . data segment 140-N at TN). The ingest entity 120 (e.g., the scheduling module 134) transmits the data segments 140 upon receiving the data segments 140 from the storage entities 110. In some implementations, the ingest entity 120 purges a data segment 140 after delivering the data segment 140 to the client device 20. Since the rate at which the ingest entity 120 receives the data segments 140 from the storage entities 110 is a function of the requested data transfer rate 28, servicing the request 22 does not result in excessive buffering of data segments 140 at the ingest entity 120.

In some implementations, the scheduling module 134 schedules the read requests 136 according to a storage utilization threshold (e.g., a storage utilization criterion). In other words, in some implementations, the scheduling module 134 schedules the read requests 136 such that a storage utilization threshold is satisfied. In some examples, the storage utilization threshold includes a predetermined percentage (e.g., 25%). In such examples, the scheduling module 134 schedules the read requests 136 such that the data segments 140 cached at the ingest entity 120 represent less than the predetermined percentage of the requested file. In some scenarios, the predetermined percentage is configurable (e.g., by an administrator of the storage system 100). In some examples, the storage utilization threshold includes a predetermined amount of time. In such examples, the scheduling module 134 schedules the read requests 136 such that the data segments 140 are cached at the ingest entity 120 for an amount of time that is less than the predetermined amount of time.

In some implementations, the scheduling module 134 compares the requested data transfer rate 28 with a threshold data transfer rate (e.g., a constant, or a realizable data transfer rate based on current network conditions). If the requested data transfer rate 28 breaches (e.g., exceeds, or is less than) a function of the threshold data transfer rate, then the scheduling module 134 schedules the read requests 136 based on the threshold data transfer rate. In some implementations, the threshold data transfer rate represents a constant that is configurable by a human operator (e.g., a system administrator of the storage system 100). In some implementations, the threshold data transfer rate represents a data transfer rate (e.g., a maximum data transfer rate) that the storage system 100 (e.g., one or more of the storage entities 110 and/or the ingest entity 120) supports. In some implementations, the threshold data transfer rate varies based on network conditions within the storage system 100 and/or network conditions external to the storage system 100. For example, in some implementations, the threshold data transfer rate represents a realizable data transfer rate.

In some implementations, the request 22 indicates that the requested file be delivered according to a best effort delivery scheme. In other words, the request 22 indicates that the requested file be delivered as fast as possible. In some examples, the data consumption rate of the client device 20 is slower than the speed at which the ingest entity 120 can transfer the file to the client device 20. As such, the ingest entity 120 determines the data consumption rate of the client device 20, and schedules the read requests 136 for the data segments 140 based on the determined data consumption rate. In some scenarios, the ingest entity 120 determines the data consumption rate of the client device 20 based on feedback information that the ingest entity 120 receives upon transmitting some of the earlier data segments 140 (e.g., data segment 140-1) in the series of data segments 140. If the data consumption rate of the client device 20 varies, the ingest entity 120 varies the rate at which the ingest entity 120 schedules the reception of the data segments 140. In some implementations, the rate at which the ingest entity 120 receives the data segments 140 from the storage devices 110 is a function of the data consumption rate of the client device 20. In some examples, the rate at which the ingest entity 120 receives the data segments 140 from the storage devices 110 is within a threshold range of the data consumption rate of the client device 20 (e.g., within 10%). The ingest entity 120 schedules the read requests 136 based on the data consumption rate of the client device 20 in order to avoid caching more data segments 140 that needed.

In some implementations, some of the data segments 140 are cached at the ingest entity 120 before they are transmitted to the client device 20. In other words, in some implementations, the rate at which the ingest entity 120 receives the data segments 140 is higher than the requested data transfer rate 28 or the data consumption rate of the client device 20. This allows the ingest entity 120 to store one or more data segments 140 in a buffer, so that the ingest entity 120 can provide the data segments 140 to the client device 20 at a higher rate if the requested data transfer rate 28 or the data consumption rate increases while the file is being transferred. In some implementations, if the data consumption rate of the client device 20 is lower than a threshold (e.g., a minimum data transfer rate), the ingest entity 120 stops scheduling the read requests 136 for a period of time. In some implementations, if the ingest server 120 cannot provide at least a threshold data transfer rate (e.g., a minimum threshold data transfer rate) for the request 22, the ingest entity 120 does not accept the request 22 from the client device 20.

Figure 3A:
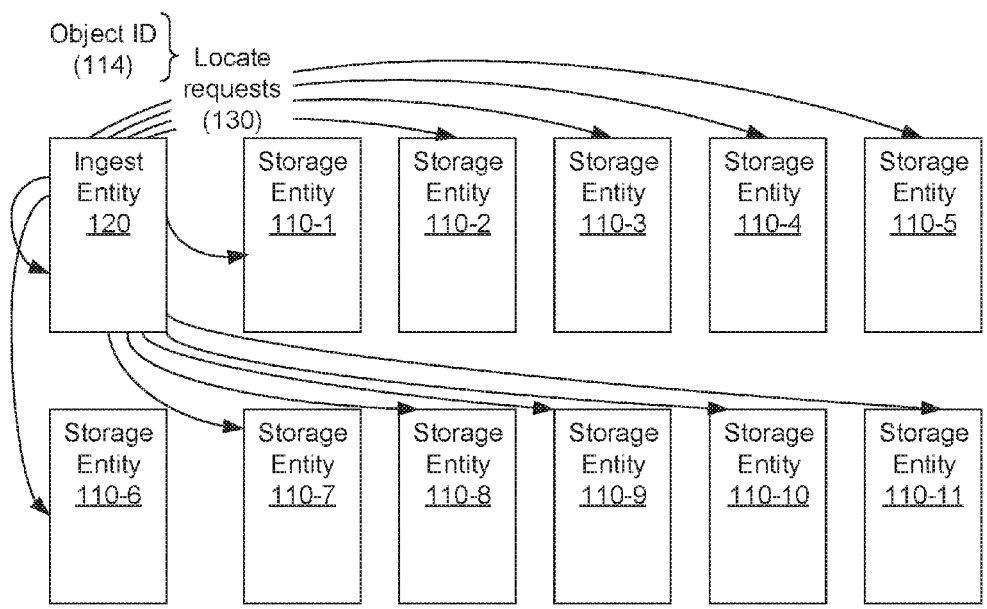
FIG. 3A is a diagram illustrating an ingest entity transmitting locate requests to storage entities in accordance with some implementations.

FIG. 3A illustrates an example interaction between the ingest entity 120 and the storage entities 110. In the example of FIG. 3A, there are eleven storage entities 110 (e.g., storage entities 110-1, 110-2 ... 110-11). As exemplified, the ingest entity 120 transmits locate requests 130 to the storage entities 110 to determine where various data segments 140 of the requested file are located. In the example of FIG. 3A, the ingest entity 120 sends a locate request 130 to itself because, in this example, the ingest entity 120 also serves as a storage entity 110. In some implementations, a locate request 130 includes the object ID 114. The storage entities 110 utilize the object ID 114 to determine whether they store any data segments 140 associated with the object ID 114. For example, in some implementations, each storage entity 110 maintains an index that indexes object IDs to data segment IDs for data segments 140 that are stored at the storage entity 110. In some scenarios, each storage entity 110 queries its respective index with the object ID 114 to identify any data segments 140 that are stored at the storage entity 110.

Figure 3B:
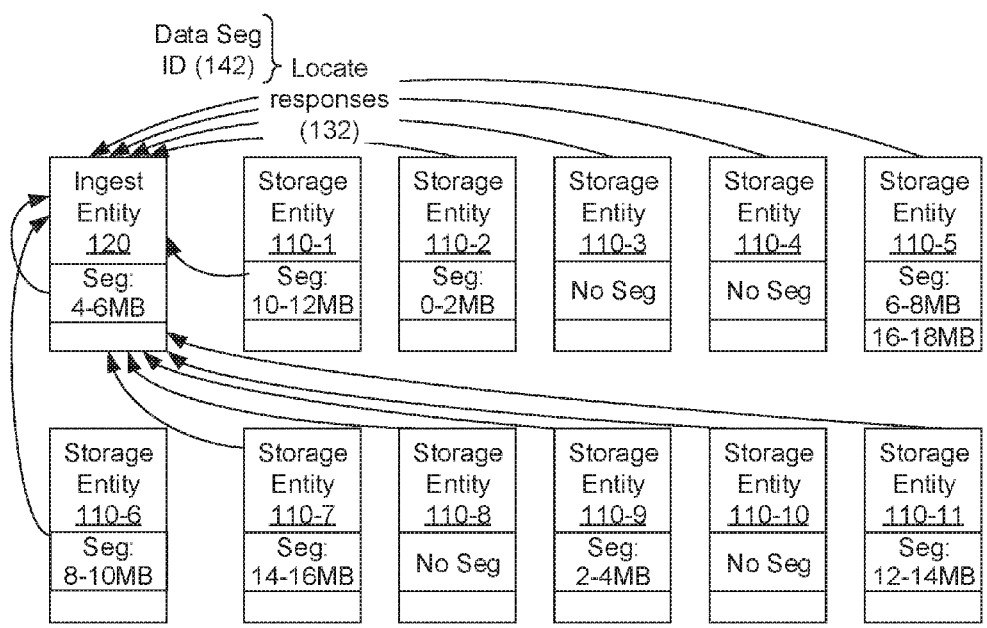
FIG. 3B is a diagram illustrating the ingest entity receiving locate responses from the storage entities in accordance with some implementations.

FIG. 3B is a diagram illustrating the ingest entity 120 receiving locate responses 132 from the storage entities 110 in accordance with some implementations. A locate response 132 from a storage entity 110 indicates whether the storage entity 110 stores any data segments 140 of the requested file (e.g., data segments 140 associated with the object ID 114). In some implementations, if a storage entity 110 stores a data segment 140 associated with the object ID 114, the storage entity 110 includes a data segment ID 142 for the data segment 140 in its locate response 132 to the ingest entity 120. Table 1 illustrates the information that the ingest entity 120 receives via the locate responses 132.

TABLE 1

| Location of various data segments | |
|---|---|
| Data segment | Location |
| 0-2 MB | Storage entity 110-2 |
| 2-4 MB | Storage entity 110-9 |
| 4-6 MB | Ingest entity 120 |
| 6-8 MB | Storage entity 110-5 |
| 8-10 MB | Storage entity 110-6 |
| 10-12 MB | Storage entity 110-1 |
| 12-14 MB | Storage entity 110-11 |
| 14-16 MB | Storage entity 110-7 |
| 16-18 MB | Storage entity 110-5 |

In some implementations, a locate response 132 from a storage entity 110 indicates whether the storage entity 110 stores data segments 140 or parity segments. In some scenarios, the ingest entity 120 determines that one or more of the data segments 140 are missing/damaged/corrupted. In such scenarios, the ingest entity 120 utilizes the parity segments to construct/repair the missing/damaged/corrupted data segments 140. In some implementations, the ingest entity 120 only receives locate responses 132 from storage entities 110 that store data segments 140. In such implementations, the ingest entity 120 waits for a predetermined amount of time to receive the locate responses 132. If the ingest entity 120 does not receive a locate response 132 from a storage entity 110 within the predetermined amount of time, the ingest entity 120 determines that the storage entity 110 does not store any data segments 140 associated with the object ID 114.

Figure 4:
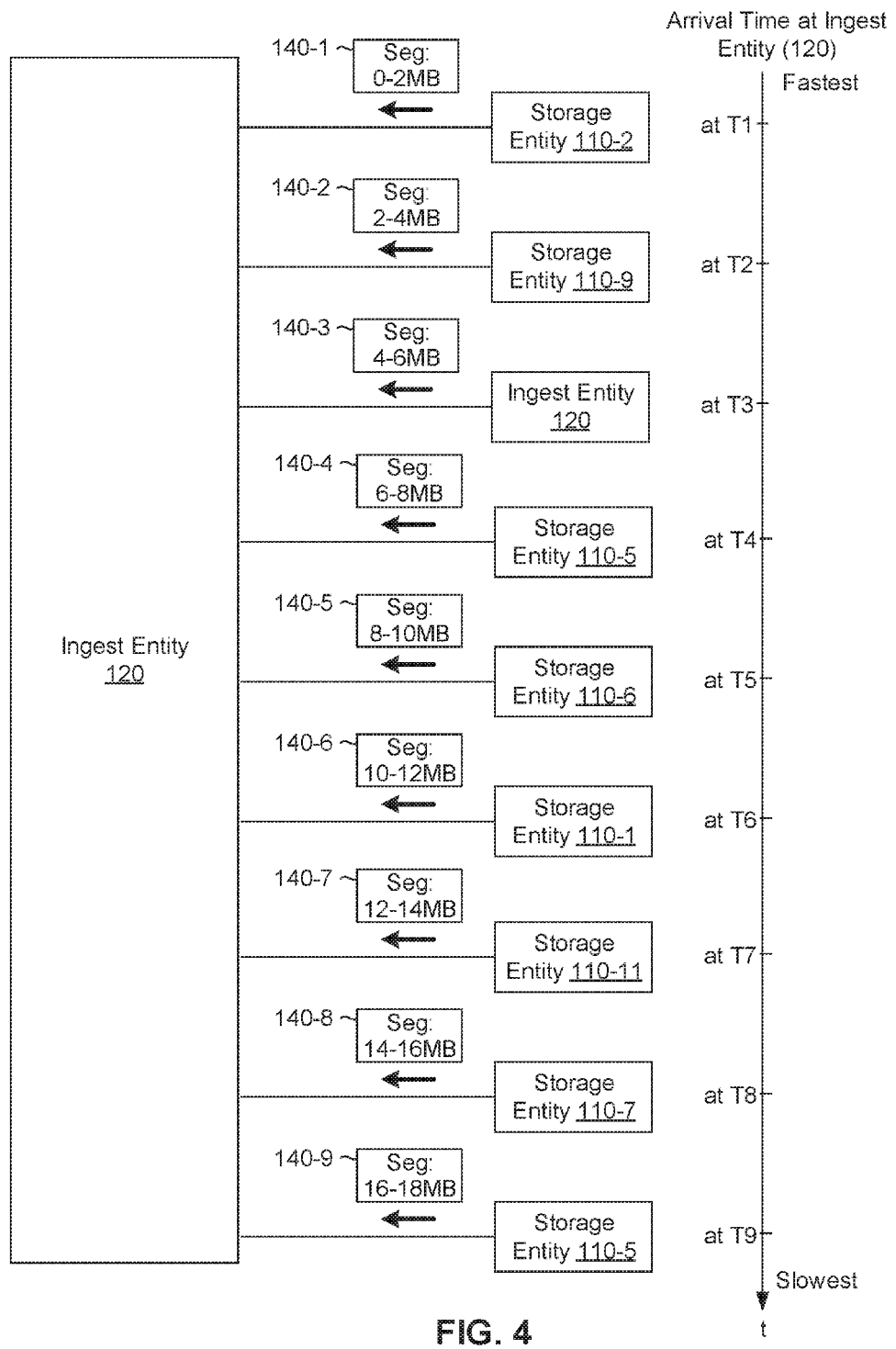
FIG. 4 is a sequence diagram illustrating the ingest entity receiving data segments of an erasure-coded file at different times in accordance with some implementations.

FIG. 4 illustrates a scheduled sequence of data segments 140 arriving at the ingest entity 120 at different arrival times (e.g., times T1, T2 ... T9). In various implementations, the arrival times are a function of the requested data transfer rate 28 and/or the data consumption rate of the client device 20. In other words, the arrival times are selected such that the rate at which the ingest entity 120 receives the data segments 140 is within a threshold range (e.g., within 10%) of the requested data transfer rate 28 or the data consumption rate of the client device 20. In some implementations, the sequence in which the data segments 140 arrive at the ingest entity 120 represents the order of the data segments 140 within the requested file. The ingest entity 120 transmits the data segments 140 to the client device 20 soon after (e.g., immediately after) receiving the data segments 140. Moreover, in some implementations, the ingest entity 120 purges (e.g., deletes) each data segment 140 soon after (e.g., immediately after) transmitting the data segment 140 to the client device 20. This approach reduces unnecessary caching of the data segments 140 at the ingest entity 120.

As illustrated in FIG. 4, at time T1, the ingest entity 120 receives a data segment 140-1 that corresponds with 0-2 MB of the file. At time T2, the ingest entity 120 receives a data segment 140-2 that corresponds with 2-4 MB of the file. At time T3, the ingest entity 120 retrieves a data segment 140-3 that corresponds with 4-6 MB of the file. At time T4, the ingest entity receives a data segment 140-4 that corresponds with 6-8 MB of the file. At time T5, the ingest entity 120 receives a data segment 140-5 that corresponds with 8-10 MB of the file. At time T6, the ingest entity 120 receives a data segment 140-6 that corresponds with 10-12 MB of the file. At time T7, the ingest entity 120 receives a data segment 140-7 that corresponds with 12-14 MB of the file. At time T8, the ingest entity 120 receives a data segment 140-8 that corresponds with 14-16 MB of the file. At time T9, the ingest entity 120 receives a data segment 140-9 that corresponds with 16-18 MB of the file.

Figure 5:
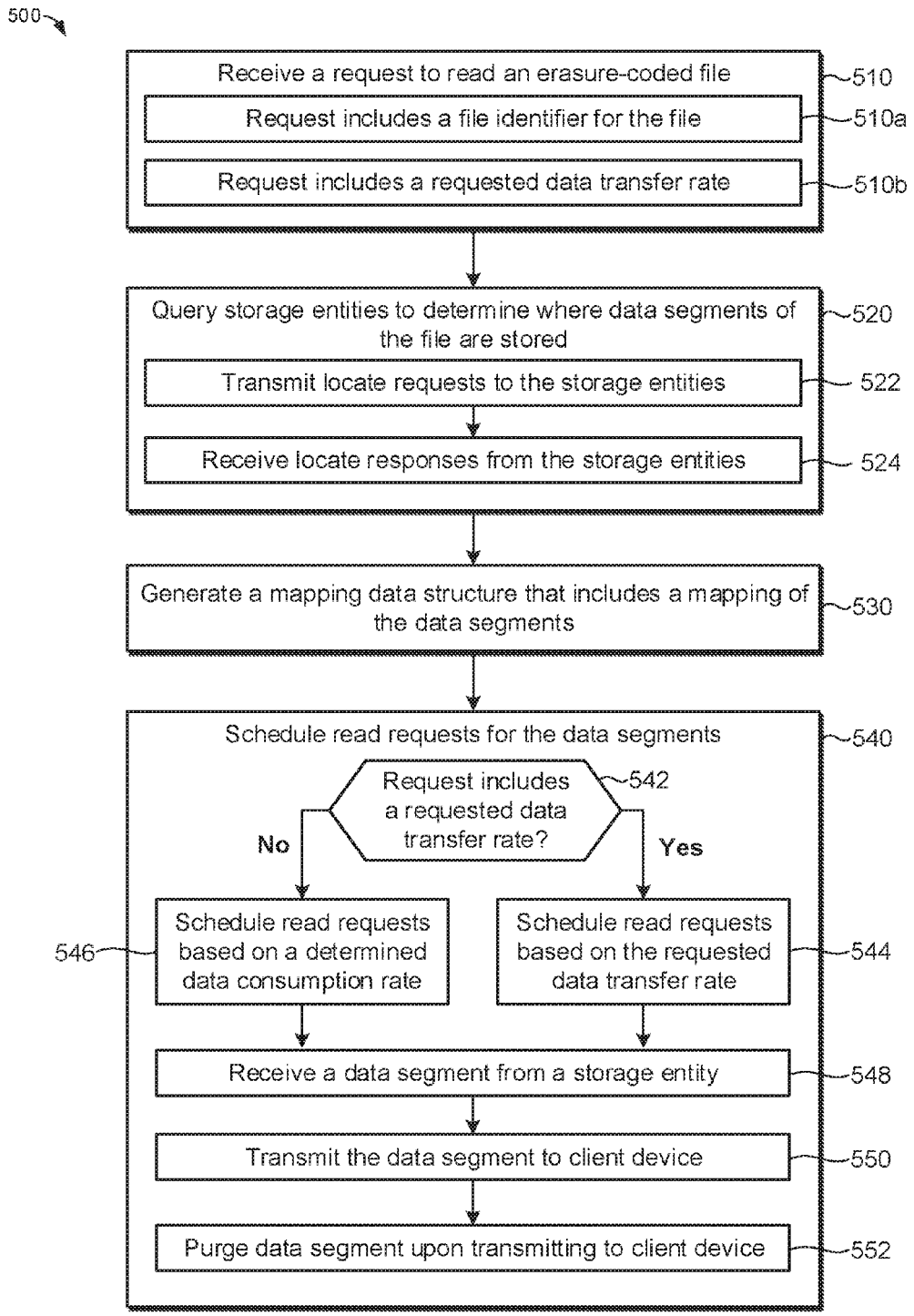
FIG. 5 is a flowchart representation of a method of reading an erasure-coded file striped across various storage entities in accordance with some implementations.

FIG. 5 is a flowchart representation of a method 500 of reading an erasure-coded file striped across various storage entities in accordance with some implementations. In various implementations, the method 500 is implemented as a set of computer readable instructions that are executed at the storage system. For example, in various implementations, the method 500 is performed by the ingest entity 120 shown in FIG. 2. Briefly, the method 500 includes receiving a request to read an erasure-coded file, querying storage entities to determine where data segments of the file are located, generating a mapping data structure that includes a mapping of the data segments, and scheduling read requests for the data segments.

As represented by block 510, in various implementations, the method 500 includes receiving a request to read an erasure-coded file (e.g., the request 22 shown in FIGS. 1 and 2). In some implementations, the method 500 includes receiving the request from a client device (e.g., the client device 20 shown in FIG. 1). In various implementations, the request includes information that identifies the requested file. For example, as represented by block 510a, in some implementations, the request includes a file ID that identifies the file (e.g., the file ID 24 shown in FIGS. 1 and 2). In some examples, the request also includes an offset (e.g., the offset 26 shown in FIGS. 1 and 2). As represented by block 510b, in some implementations, the request includes a requested data transfer rate (e.g., the requested data transfer rate 28 shown in FIGS. 1 and 2). In some examples, the request includes additional information.

As represented by block 520, in various implementations, the method 500 includes querying storage entities to determine where data segments of the file are stored. As represented by block 522, in some implementations, the method 500 includes transmitting locate requests to the storage entities (e.g., the locate requests 130 shown in FIGS. 2 and 3A). In some examples, the locate requests include information that identifies the file (e.g., an object ID such as the object ID 114 shown in FIG. 3A). As represented by block 524, the method 500 includes receiving locate responses in response to transmitting the locate requests. A locate response from a storage entity indicates whether the storage entity stores any data segments of the file. If a storage entity stores a data segment of the file, then the locate response from the storage entity includes information that identifies the data segment (e.g., a data segment ID such as the data segment ID 142 shown in Figure 3B).

As represented by block 530, in some implementations, the method 500 includes generating (e.g., synthesizing) a mapping data structure that includes a mapping of the data segments (e.g., the mapping 128 shown in FIG. 2). The mapping indicates the location of various data segments of the file (e.g., as illustrated in Table 1). In some implementations, the method 500 includes generating the mapping based on the information received via the locate responses. In some examples, the method 500 includes determining a sequence of the data segments within the requested file. In other words, in some examples, the method 500 includes ordering the data segments according to their order within the file. In various implementations, for each data segment, the mapping indicates which storage entity stores the data segment.

As represented by block 540, in various implementations, the method 500 includes scheduling read requests for the data segments based on the sequence indicated by the mapping (e.g., the read requests 136 shown in FIGS. 1 and 2). As described herein, in some implementations, scheduling the read requests satisfies a storage utilization threshold. In various implementations, the method 500 includes scheduling the read requests on the basis of the sequence of the data segments in the erasure-coded file. For example, in some implementations, the method 500 includes scheduling the read requests such that an order in which the data segments arrive at the ingest entity corresponds with the sequence of the data segments within the erasure-coded file. For example, as illustrated in FIG. 4, a first data segment that corresponds with 0-2 MB of the file arrives before a second data segment that corresponds with 2-4 MB of the file. As represented by block 542, in some implementations, the method 500 includes determining whether the request includes a requested data transfer rate. If the request includes a requested data transfer rate then the method 500 proceeds to block 544, otherwise the method 500 proceeds to block 546.

At represented by block 544, the method 500 includes scheduling read requests based on the requested data transfer rate. In other words, in various implementations, the read requests are a function of the requested data transfer rate, so that the rate at which the data segments arrive at the ingest entity is within a threshold range of the requested data transfer rate. At block 546, the method 500 includes scheduling read requests based on a determined data consumption rate of the client device. In other words, the read requests are a function of the determined data consumption rate, so that the rate at which the data segments arrive at the ingest entity is within a threshold range of the determined data consumption rate. In various implementations, scheduling the read requests at blocks 544 and 546 includes instantiating data containers (e.g., JSON objects) that represent the read requests and transmitting the read requests. In some implementations, the method 500 includes indicating a time in each scheduled read request at which the storage entity is to transmit the requested data segment to the ingest entity.

As represented by block 548, in various implementations, the method 500 includes receiving a data segment from a storage entity. Of note, the method 500 includes receiving various data segments at different times. The times at which the data segments arrive are a function of the requested data transfer rate and/or the determined data consumption rate. Upon receiving a data segment, the method 500 includes transmitting the data segment to the client device, as represented by block 550. In some implementations, the method 500 includes transmitting the data segment to the client device soon after e.g., immediately after) receiving the data segment from the storage entity. As represented by block 552, in some implementations, the method 500 includes purging the data segment soon after (e.g., immediately after) the data segment is transmitted to the client device. In various implementations, the operations indicated by blocks 548, 550 and 552 are repeated for various data segments (e.g., all the data segments) of the requested file.

Figure 6:
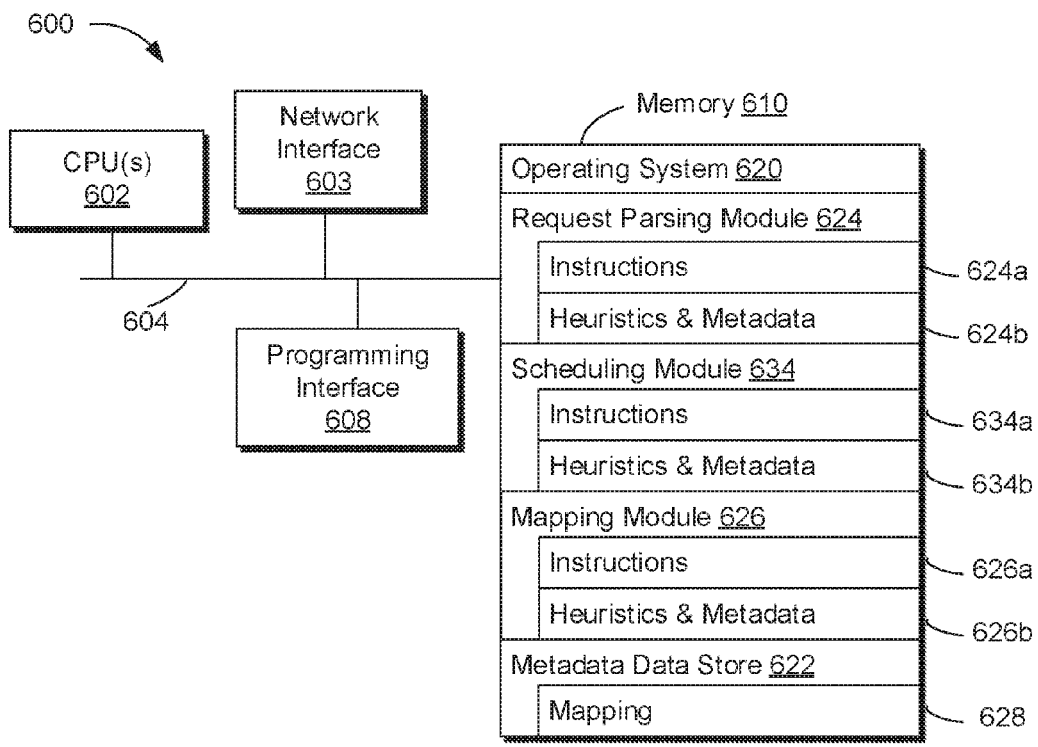
FIG. 6 is a block diagram of a server system enabled with various modules that are provided to read an erasure-coded file striped across various storage entities in accordance with some implementations.

FIG. 6 is a block diagram of a server system 600 enabled with one or more components of an ingest entity of a storage system (e.g., the ingest entity 120 of the storage system 100 shown in FIGS. 1 and 2) according to some implementations. While certain specific features are illustrated, those of ordinary skill in the art will appreciate from the present disclosure that various other features have not been illustrated for the sake of brevity, and so as not to obscure more pertinent aspects of the implementations disclosed herein. To that end, as anon-limiting example, in some implementations the server system 600 includes one or more processing units (CPUs) 602, a network interface 603, a memory 610, a programming interface 608, and one or more communication buses 604 for interconnecting these and various other components.

In some implementations, the network interface 603 is provided to, among other uses, establish and maintain a metadata tunnel between a cloud hosted network management system and at least one private network including one or more compliant devices. In some implementations, the communication buses 604 include circuitry that interconnects and controls communications between system components. The memory 610 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. The memory 610 optionally includes one or more storage devices remotely located from the CPU(s) 602. The memory 610 comprises a non-transitory computer readable storage medium.

In some implementations, the memory 610 or the non-transitory computer readable storage medium of the memory 610 stores the following programs, modules and data structures, or a subset thereof including an optional operating system 620, a metadata data store 622, a request parsing module 624, a mapping module 626, and a scheduling module 634. In various implementations, the metadata data store 622, the request parsing module 624, the mapping module 626 and the scheduling module 634 are similar to the metadata data store 122, the request parsing module 124, the mapping module 126, and the scheduling module 134, respectively, shown in FIG. 2. In various implementations, the metadata data store 622 stores metadata regarding objects stored in the storage system. For example, in some implementations, the metadata data store 622 stores object IDs and file IDs associated with objects that are stored in the storage system.

The operating system 620 includes procedures for handling various basic system services and for performing hardware dependent tasks.

In various implementations, the request parsing module 624 parses a request from a client device (e.g., the request 22 shown in FIGS. 1 and 2). To that end, in various implementations, the request parsing module 624 includes instructions and/or logic 624a, and heuristics and metadata 624b. In various implementations, the mapping module 626 generates a mapping data structure that includes a mapping 628 (e.g., the mapping 128 shown in FIG. 2). The mapping 628 indicates the location of various data segments of the requested file. In some implementations, the mapping module 626 stores the mapping data structure (e.g., the mapping 628) in the metadata data store 622. To that end, in various implementations, the mapping module 626 includes instructions and/or logic 626a, and heuristics and metadata 626b. In various implementations, the scheduling module 634 schedules read requests (e.g., the read requests 136 shown in FIG. 2) for the data segments of the requested file. In some implementations, the scheduling module 634 accesses the mapping data structure (e.g., the mapping 628) to identify the storage entity that stores a particular data segment, so that the scheduling module 634 can transmit the read request to the storage entity that stores that particular data segment. To that end, in various implementations, the scheduling module 634 includes instructions and/or logic 634a, and heuristics and metadata 634b. In various implementations, the server system 600 performs the method 500 shown in FIG. 5.

While various aspects of implementations within the scope of the appended claims are described above, it should be apparent that the various features of implementations described above may be embodied in a wide variety of forms and that any specific structure and/or function described above is merely illustrative. Based on the present disclosure one skilled in the art should appreciate that an aspect described herein may be implemented independently of any other aspects and that two or more of these aspects may be combined in various ways. For example, an apparatus may be implemented and/or a method may be practiced using any number of the aspects set forth herein. In addition, such an apparatus may be implemented and/or such a method may be practiced using other structure and/or functionality in addition to or other than one or more of the aspects set forth herein.

It will also be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. A method comprising:
at an ingest entity of an enterprise object storage system that includes a cluster of storage entities, wherein the ingest entity includes a non-transitory computer readable storage medium, and one or more processors:
querying the storage entities of the cluster to determine where data segments of an erasure-coded file are located within the cluster, in response to a request to read the erasure-coded file striped across one or more storage entities within the cluster of storage entities;

generating a mapping data structure that includes a mapping of the data segments across the storage entities, wherein the mapping data structure includes indications of a sequence for the data segments within the erasure-coded file; and scheduling read requests for the data segments based on the sequence indicated by the mapping, wherein scheduling the read requests satisfies a storage utilization threshold.

2. The method of claim 1, wherein scheduling the read requests includes scheduling the read requests in accordance with a requested data transfer rate specified in the request.

3. The method of claim 2, further comprising:
determining that the requested data transfer rate breaches a threshold data transfer rate; and
scheduling the read requests in accordance with the threshold data transfer rate.

4. The method of claim 1, further comprising:
receiving one or more data segments of the erasure-coded file from the storage entities; and
transmitting the one or more data segments of the erasure-coded file to a client device associated with the request.

5. The method of claim 4, further comprising:
determining a data consumption rate of the client device in accordance with feedback information associated with transmitting the one or more data segments to the client device; and
wherein scheduling the read requests for the data segments includes scheduling the read requests in accordance with the determined data consumption rate of the client device.

6. The method of claim 1, wherein querying the storage entities comprises querying the storage entities with a file identifier and an offset value from the start of the erasure-coded file that are specified in the request.

7. The method of claim 1, further comprising:
transmitting the scheduled read requests to the one or more storage entities associated with respective data segments of the erasure-coded file; and
receiving data segments from the storage entities in response to transmitting the scheduled read requests.

8. The method of claim 7, further comprising:
caching a subset of the received data segments; and
transmitting one or more data segments to a client device associated with the request, in accordance with the sequence of the data segments in the erasure-coded file.

9. The method of claim 1, wherein scheduling read requests for the data segments includes scheduling the read requests on the basis of the sequence of the data segments in the erasure-coded file.

10. The method of claim 1, wherein the request includes a request to delay sending one or more data segments of the erasure-coded file.

11. The method of claim 1, further comprising:
receiving the request to read the erasure-coded file striped across one or more storage entities within the cluster of storage entities.

12. An enterprise object storage system comprising:
a cluster of storage entities that are configured to store erasure-coded files in a distributed manner; and
an ingest entity configured to:
query the storage entities of the cluster to determine where data segments of an erasure-coded file are located within the cluster, in response to a request to read the erasure-coded file striped across one or more storage entities within the cluster of storage entities;
generate a mapping data structure that includes a mapping of the data segments across the storage entities, wherein the mapping data structure includes indications of a sequence for the data segments within the erasure-coded file; and
schedule read requests for the data segments based on the sequence indicated by the mapping, wherein scheduling the read requests satisfies a storage utilization threshold.

13. The enterprise object storage system of claim 12, wherein scheduling the read requests includes scheduling the read requests in accordance with a requested data transfer rate specified in the request.

14. The enterprise object storage system of claim 12, wherein the ingest entity is further configured to:
determine that the requested data transfer rate specified in the request breaches a threshold data transfer rate; and
schedule the read requests in accordance with the threshold data transfer rate.

15. The enterprise object storage system of claim 12, wherein the ingest entity is further configured to:
receive one or more data segments of the erasure-coded file from the storage entities; and
transmit the one or more data segments of the erasure-coded file to a client device associated with the request.

16. The enterprise object storage system of claim 15, wherein the ingest entity is further configured to:
determine a data consumption rate of the client device, in accordance with feedback information associated with transmitting the one or more data segments to the client device; and
wherein scheduling the read requests for the data segments includes scheduling the read requests in accordance with the determined data consumption rate of the client device.

17. The enterprise object storage system of claim 12, wherein the ingest entity is further configured to:
transmit the scheduled read requests to the one or more storage entities associated with respective data segments of the erasure-coded file; and
receive data segments from the storage entities in response to transmitting the scheduled read requests.

18. The enterprise object storage system of claim 12, wherein the ingest entity is further configured to:
cache a subset of the received data segments; and
transmit one or more data segments to a client device associated with the request, in accordance with the sequence of the data segments in the erasure-coded file.

19. The enterprise object storage system of claim 12, wherein the ingest entity is further configured to:
receive the request to read the erasure-coded file striped across one or more storage entities within the cluster of storage entities.

20. A device comprising:
a processor configured to execute computer readable instructions included on a non-transitory memory; and
a non-transitory memory including computer readable instructions, that when executed by the processor, cause the device to:
query storage entities of a cluster to determine where data segments of an erasure-coded file are located within the cluster, in response to a request to read the erasure-coded file striped across one or more storage entities within the cluster of storage entities;
generate a mapping data structure that includes a mapping of the data segments across the storage entities, wherein the mapping data structure includes indications of a sequence for the data segments within the erasure-coded file; and schedule read requests for the data segments based on the sequence indicated by the mapping, wherein scheduling the read requests satisfies a storage utilization threshold.

\* \* \* \* \*